(12) United States Patent
Bach et al.

(10) Patent No.: US 9,642,188 B2
(45) Date of Patent: May 2, 2017

(54) ELECTRIC HEATER FOR HEATING SYNTHETIC MATERIALS AND METHOD FOR OPERATING THE ELECTRIC HEATER

(71) Applicant: Siemens Aktiengesellschaft, Munich (DE)

(72) Inventors: Christine Bach, Nuremberg (DE); Axel Haase, Erlangen (DE); Reinhard Schneider, Bamberg (DE); Jürgen Stoll, Fuerth (DE); Philipp Zinn, Lauf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/922,454

(22) Filed: Oct. 26, 2015

(65) Prior Publication Data
US 2016/0119976 A1    Apr. 28, 2016

(30) Foreign Application Priority Data
Oct. 27, 2014    (DE) .................. 10 2014 221 790

(51) Int. Cl.
*H05B 1/02*    (2006.01)
*H05B 3/00*    (2006.01)
*G01R 19/10*    (2006.01)

(52) U.S. Cl.
CPC .............. *H05B 3/00* (2013.01); *G01R 19/10* (2013.01); *H05B 1/023* (2013.01)

(58) Field of Classification Search
CPC . H05B 3/00; H05B 1/02; H05B 1/023; H05B 3/0038; G01R 19/10
(Continued)

(56) References Cited

U.S. PATENT DOCUMENTS 3,636,310 A * 1/1972 Hosokawa ............. G05D 23/24
                                             219/494
6,097,009 A * 8/2000 Cole ...................... H02H 5/043
                                             219/212
(Continued)

FOREIGN PATENT DOCUMENTS

DE    10 2008 033320        3/2010
DE    20 2013 003006        4/2013
(Continued)

*Primary Examiner* — Mark Paschall
(74) *Attorney, Agent, or Firm* — Cozen O'Connor

(57) ABSTRACT

An electric heater (4) of a synthetic-material molding system (2) defines a current path (6) that includes a first measuring pickup (20), a second measuring pickup (22), a switch (16) and a third measuring pickup (24), all connected in series, wherein a heating element (14) is connected between the first measuring pickup (20) and the second measuring pickup (22). The electric heater (4) also has a diagnostic path (28) that includes a first diagnostic pickup (30), a first voltage measuring device (52), a second diagnostic pickup (32), a second voltage measuring device (54) and a third diagnostic pickup (34), all connected in series. The first measuring pickup (20) is electrically connected to the first diagnostic pickup (30) by a first protective impedance (38), the second measuring pickup (22) is electrically connected to the second diagnostic pickup (32) by a second protective impedance (40), and the third measuring pickup (24) is electrically connected to the third diagnostic pickup (34) by a third protective impedance (42).

11 Claims, 2 Drawing Sheets

(58) Field of Classification Search
USPC .............. 219/494, 483–486, 501, 505, 212
See application file for complete search history.

(56) References Cited

U.S. PATENT DOCUMENTS

| | | | | |
|---|---|---|---|---|
| 6,355,912 | B2 * | 3/2002 | Allard ................. | H05B 1/0272 219/212 |
| 6,407,469 | B1 * | 6/2002 | Cline .................. | A61H 33/005 307/11 |
| 7,603,249 | B1 * | 10/2009 | Walker ................. | G01K 7/425 374/100 |
| 8,097,836 | B2 * | 1/2012 | Raterman ........... | B05C 11/1042 219/481 |
| 8,610,315 | B2 * | 12/2013 | Ushiro ................. | G03G 15/80 307/131 |
| 9,312,081 | B2 * | 4/2016 | Douglass ............ | H01H 9/10 |
| 2016/0037582 | A1 * | 2/2016 | Novikov ............. | H05B 1/0227 219/481 |

FOREIGN PATENT DOCUMENTS

| | | |
|---|---|---|
| WO | WO 2010/119028 | 10/2010 |
| WO | WO 2014/152794 | 9/2014 |

\* cited by examiner

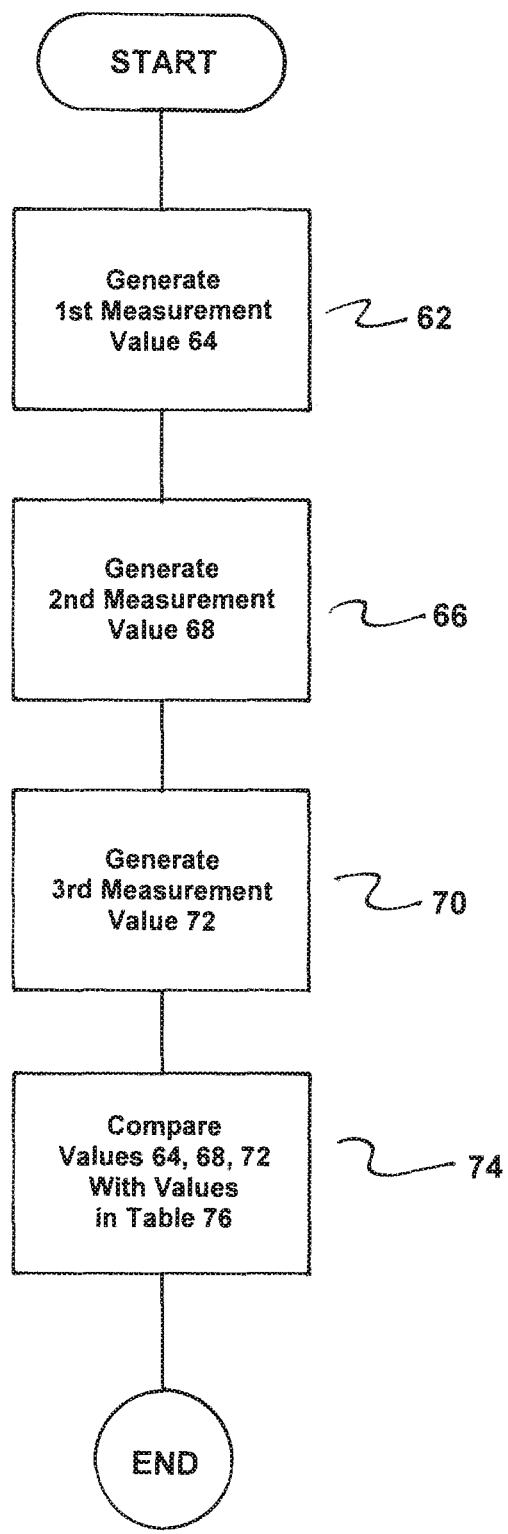

ELECTRIC HEATER FOR HEATING SYNTHETIC MATERIALS AND METHOD FOR OPERATING THE ELECTRIC HEATER

FIELD OF THE INVENTION

The present invention relates to an electric heater, such as an electric heater of a synthetic-material molding system, having a current path that includes a heating element, and to a method for operating such an electric heater.

BACKGROUND OF THE INVENTION

It is increasingly common for foodstuffs and drinks to be stored in containers constructed of a synthetic material. A thermoplastic material such as polyethylene terephthalate (PET) is commonly employed for the synthetic material. In this context, plates or films of the thermoplastic synthetic material are first heated and then, in a subsequent work step, are pressed or otherwise formed into a specific, desired shape using, for example, a press defining a corresponding contour, compressed air, or by generating a vacuum.

The generation of heat is typically effected by means of an electric heater that includes a heating element, and which permits relatively precise setting of the desired temperature. The heating element is commonly implemented by a heating coil. Due to its comparatively high electrical resistance, the coil is typically activated by a current flow, with which electrical energy is converted into thermal energy. The electric current is usually fed selectively to the coil by means of a semiconductor switch, thus avoiding propagation of an electric arc in this region. As a result of the comparatively high current flow and the comparatively high thermal load, damage to the switch or even to the heating element is possible. For example, individual or groups of heating wires or turns of the heating coil may be or become short circuited, such that although a flow of current through the coil remains, the resistance of the heating element is comparatively low. As a result, under such circumstances the thermoplastic synthetic material will no longer be fully heated and the intended desired shaping or deformation of the material will no longer be possible.

In order to avoid damage to the system that is used for deformation of the thermoplastic material, it is therefore important to detect such failures within a relatively short time period after the failure occurs. And, to additionally to ensure that any operational stoppage of the system is comparatively short, it is likewise necessary to quickly identify the relevant fault, i.e. to establish whether it is the switch or the heating element that has failed or is damaged. Toward that end, an electric voltage measuring device that monitors voltage is normally connected in parallel with the switch and the heating element. An unexpectedly marked voltage drop is used as a condition for identifying damage to at least a part of the electric heater.

Preventing damage to the voltage measuring device as a result of an unusually high current flow is achieved by electrically isolating it from the electrical circuit containing the heating element. An optocoupler is typically used to provide such electrical isolation, but optocouplers have only a limited service life. An optocoupler is moreover characterized by relatively rapid aging, and must therefore be replaced at specific time intervals in order to ensure that the electric voltage measuring device continues to function correctly.

SUMMARY OF THE INVENTION

It is therefore an object of the invention to provide an improved electric heater, and an advantageous method for operating such an electric heater, whereby reliability and fault diagnosis are improved and costs are reduced.

In certain embodiments implementing the present invention, the electric heater is part of an industrial heating system that is used to process or produce a wide range of articles such, by way of purely illustrative example, as foods and drinks, photovoltaic cells, or automobiles. In preferred implementations of the inventive constructions, the electric heater is used for heating synthetic materials, wherein the electric heater is part of a synthetic-material molding system by means of which thermoplastic synthetic materials are heated and molded into specific desired shapes. Such a synthetic-material molding system is thus used to manufacture specific products made of synthetic material. Alternatively, the electric heater can form a part of a drying oven.

The electric heater has a current path into which a heating element can be connected. The current path will in particular generally include the heating element, but it is at least designed and configured such that the heating element is connected into the current path. Thus, the heating element can form an integral element of the electric heater, or can be a separate element to which the electric heater of the invention is connectable. In contemplated embodiments, the heating element comprises a heating coil that is implemented by a heating resistor. The heating resistor, in preferred embodiments, comprises by way of example a comparatively high-ohmic wire by means of which electrical energy is converted into thermal energy as current flows through the wire. The heating coil may be formed, by way of example, of kanthal or a nickel-iron alloy.

The current path includes a switch by means of which an electric current flow through the current path can be enabled and interrupted. The current path also includes first, second and third measuring pickups, the second measuring pickup being arranged between the heating element and the switch, the heating element being electrically arranged between the first and the second measuring pickup, and the switch being electrically arranged between the second and third measuring pickups. In other words, the first measuring pickup, the heating element, the second measuring pickup, the switch and the third measuring pickup of the current path are serially connected in that order.

The electric heater also includes a diagnostic path having a first diagnostic pickup, a second diagnostic pickup and a third diagnostic pickup, all of which are connected in series, a first voltage measuring device electrically connected between the first diagnostic pickup and the second diagnostic pickup, and a second voltage measuring device electrically connected between the second and the third diagnostic pickups. Thus, the first diagnostic pickup, the first voltage measuring device, the second diagnostic pickup, the second voltage measuring device and the third diagnostic pickup are serially connected in that order in the diagnostic path.

The first measuring pickup is electrically connected to the first diagnostic pickup by means of a first protective impedance, the second measuring pickup is electrically connected to the second diagnostic pickup by means of a second protective impedance, and the third measuring pickup is electrically connected to the third diagnostic pickup by means of a third protective impedance. Accordingly, the diagnostic path is connected in parallel with the current path by means of first, second and third protective impedances, wherein the first voltage measuring device is connected in parallel with the heating element by means of the first and second protective impedances, and the second voltage measuring device is connected in parallel with the switch by means of the second and third protective impedances. In summary, the electric heater has a current path which has the heating element connected in series with the switch, wherein the first voltage measuring device is connected in parallel with the heating element through the first and second protective impedances, and the second voltage measuring device is connected in parallel with the switch through the second and third protective impedances. The heating element is preferably a part and element of the current path, which includes the first measuring pickup, the heating element, the second measuring pickup, the switch and the third measuring pickup, these being connected in series. Instead of including the heating element as an integral element of the electric heater, however, the current path may instead provide a connection interface or plug connector for electrical connection to a separate or external or otherwise remotely-located or separately-defined heating element.

Thus, the present invention is directed to an electric heater, in preferred implementations of a synthetic-material molding system, having a current path formed by a first measuring pickup, a second measuring pickup and a third measuring pickup connected in series, wherein the heating element is connected between the first measuring pickup and the second measuring pickup and the switch is connected between the second measuring pickup and the third measuring pickup, and having a diagnostic path formed by a first diagnostic pickup, a second diagnostic pickup and a third diagnostic pickup connected in series, wherein a first voltage measuring device is connected between the first diagnostic pickup and the second diagnostic pickup and a second voltage measuring device is connected between the second diagnostic pickup and the third diagnostic pickup, and wherein the first measuring pickup is electrically connected to the first diagnostic pickup by means of a first protective impedance, the second diagnostic pickup is electrically connected to the second diagnostic pickup by means of a second protective impedance, and the third measuring pickup is electrically connected to the third diagnostic pickup by means of a third protective impedance.

As a consequence of this construction, none of the voltage measuring devices are coupled to the current path by means of an optocoupler, thereby dispensing with the need for an optocoupler as previously utilized in the prior art. The disadvantageous characteristics of optocouplers—such as their specific activation requirements, possible non-linearities in the detected measurement signals, and their relatively pronounced ageing characteristics—are therefore not present and need not be considered in the design, manufacture and use of the electric heater of the present invention. Manufacturing costs are thus reduced, and reliability is increased since the protective impedances have greater reliability and longer service life than does an optocoupler.

In the operation of preferred embodiments of the invention, an alternating electric current is applied to the current path, and the connection interface points of the electric current source form the respective termination points of the current path. A sinusoidal alternating current may for example be used, whose amplitude (maximum current strength) is defined as less than or equal to, e.g., 100 A, 200 A, 300 A, 500 A or 1 kA. The amplitude may be defined as greater than, e.g., 0.5 A, 1 A, 5 A, 10 A, 100 A, 150 A, 250 A, 350 A or 500 A. The electric voltage applied between the connection interface points is preferably greater than, e.g., 100 V, 150 V, 200 V, 250 V, 400 V, 500 V and/or less than, e.g., 700 V, 690 V, 650 V, 600 V, 500 V or 350 V.

Each of the first, second and/or third protective impedances is a capacitive impedance or, preferably, an ohmic resistance, by way of example. In contemplated embodiments, the first, second and/or third protective impedance has a comparatively high resistance value; the resistance value may be greater than or equal to 400 k$\Omega$, 500 k$\Omega$, 600 k$\Omega$, 700 k$\Omega$, 800 k$\Omega$ or 1 M$\Omega$. In some embodiments, the resistance value may be less than or equal to 3 M$\Omega$, 2.5 M$\Omega$, 2 M$\Omega$, 1.5 M$\Omega$, 1 M$\Omega$, 0.9 M$\Omega$, 0.8 M$\Omega$ or 0.7 M$\Omega$. This ensures the flow of a relatively limited electric current through the protective impedances into the diagnostic path, thus simplifying the dimensioning of both the first and second voltage measuring devices. It is consequently possible to utilize fairly economical voltage measuring devices. This also ensures that the efficiency level of the electric heater will not be significantly affected by the presence of the diagnostic path. The resistance values of the first, second and third protective impedances are most preferably identical; i.e., in preferred embodiments the resistance value of the first protective impedance is identical to the resistance value of the second protective impedance, and this in turn is identical to the resistance value of the third protective impedance. The first, second and/or third protective impedances may also, by way of example, be structurally identical. As a consequence, little or no complex calculations are required to obtain a measurement value that corresponds to the electric voltage drop over the heating element and/or the switch; moreover, only a limited number of different components are required for the manufacture and maintenance of the electric heater, thereby reducing both the manufacturing and maintenance costs.

In an especially preferred embodiment of the invention, the first protective impedance, in particular on the side of its connection to the first diagnostic pickup, is connected to a reference potential by means of an additional impedance. In other words, a resistance divider is created by means of the additional impedance and the first protective impedance. In a contemplated embodiment, at least one of the inputs of the first voltage measuring device is thus connected to the reference potential by means of the additional impedance. The resistance value of this additional impedance is preferably comparatively low, and may be less than 50 k$\Omega$, 40 k$\Omega$, 30 k$\Omega$, 10 k$\Omega$, 5 k$\Omega$ or 1 k$\Omega$ as appropriate in the particular implementation. The resistance value may also be defined as greater than or equal to, e.g., 2 k$\Omega$, 1 k$\Omega$, 800 $\Omega$, 700 $\Omega$, 600 $\Omega$ or 500 $\Omega$ Consequently, at least one of the inputs of the first voltage measuring device has a comparatively low potential difference relative to the reference potential, thereby effectively preventing a short-circuit relative to the reference potential due to, e.g., a voltage flashover. The electric heater may include a housing that encases the first voltage measuring device and that is connected to the reference potential. The reference potential may be ground.

Alternatively or in combination with such an arrangement, the second protective impedance may be connected to the reference potential by means of an additional impedance. If both the first protective impedance and the second protective impedance are thus connected to the reference potential, it follows that the electric heater has two such additional impedances. The third protective impedance may also be connected to the reference potential by means of, for example, an additional impedance. In a particularly preferred embodiment, the first, the second, and the third protective impedances are each connected to the reference potential by means of an additional impedance, the resistance value of these respective additional impedances being substantially identical if possible, and these additional impedances preferably being structurally identical. In summary, therefore, the first protective impedance, the second protective impedance and/or the third protective impedance are preferably connected, in each case on the side of its connection to the assigned diagnostic pickup, to the reference potential by means of an additional impedance. The reference potential is preferably ground, thus essentially preventing the first or second voltage measuring device from being influenced by the ground. The first and/or second voltage measuring device is preferably enveloped or surrounded by a housing that is constructed of metal and that is electrically connected to ground. Each respective additional impedance is a capacitive impedance or preferably, e.g., an ohmic resistance.

The switch may for example be implemented by a relay. In an especially preferred embodiment, however, the switch is a semiconductor switch, thus effectively preventing an electric arc from forming when an electric current is switched along the current path. A MOSFET may, by way of illustration, be used as the switch. Alternatively the switch may be a thyristor, such that an electric voltage need no longer be applied to the respective switching inputs after a respective switching action. In a particularly preferred embodiment, the switch is a TRIAC. This also accommodates connection of an alternating current, wherein with the exception of the respective switching actions, no electric voltage is required for the purpose of activation.

By way of illustration, the first voltage measuring device may be a comparator and the second voltage measuring device is preferably a comparator. The comparators are used here solely to detect whether a potential difference is present between the individual inputs of the respective voltage measuring device. Thus, the first voltage measuring device determines whether a potential difference is present between the first diagnostic pickup and the second diagnostic pickup, which is to say that the electric voltage is evaluated qualitatively and not quantitatively. Likewise, the second voltage measuring device determines whether a potential difference is present between the second and third diagnostic pickups, i.e. whether an electric voltage is applied between the second and third diagnostic pickups. Only a digital state is captured by the respective comparator. In a contemplated embodiment, the respective voltage measuring device only captures an electric voltage which is greater than, e.g., 0.1 V, 0.2 V, 0.5 V or 1.0 V.

The two comparators are connected to a control circuit, by means of which the respective states of the comparators are evaluated. It is accordingly possible to ascertain with relative ease whether an electric voltage is present across the switch or across the heating element. The respective measurement value is compared with an expected value. For a conducting or closed switch, an electric voltage drop is thus expected between the first and second diagnostic pickups, but not between the second and third diagnostic pickups, whereas for an open switch, an electric voltage drop is expected between the second and third diagnostic pickups, but not between the first and second diagnostic pickups. In the event of a discrepancy, a fault is thereby identified. Likewise, if a setting of the switch is not known, it can be ascertained by evaluating the respective measurement values.

In an alternate embodiment, an A/D converter (also known as an analog-digital converter or an analog-digital transformer) is electrically arranged between each respective protective impedance and the associated diagnostic pickup, i.e. between the first protective impedance and the first diagnostic pickup, between the second protective impedance and the second diagnostic pickup, and between the third protective impedance and the third diagnostic pickup. This embodiment of the electric heater thus includes three A/D converters. The respective analog measurement signal of each, i.e. the respective potential, is converted into a digital word by each A/D converter, such that a digital word is present and available at the respective diagnostic pickup. In a contemplated embodiment, a computing unit determines the voltage difference by subtracting in each case the respective digital word from the corresponding digital word. The first and second voltage measuring devices may be integrated within a shared computing unit, which may be implemented as an integrated circuit (IC). A relatively compact electric heater is thereby realized, wherein on the basis of the electric voltage that is applied (and which is capable of being relatively precisely determined), any aging of the switch or of the heating element can be ascertained. If the impedance(s) connected to the reference potential is/are present, each is preferably electrically connected to the analog input of the respective A/D converter.

The current path preferably includes a fourth measuring pickup and a first fuse that is connected between the third measuring pickup and the fourth measuring pickup. Accordingly, in this embodiment, in reverse order, the current path is formed by the fourth measuring pickup, the first fuse, the third measuring pickup, the switch, the second measuring pickup, the heating element and the first measuring pickup. In addition, the diagnostic path preferably includes a third voltage measuring device, which may be configured as a comparator or a computing unit, preceded by way of example by a series-connected A/D converter. The third voltage measuring device may be structurally identical to the first and/or second voltage measuring device.

The first fuse is preferably bridged by means of a fourth protective impedance, the third voltage measuring device and the third protective impedance; thus, the third voltage measuring device is connected in parallel with the first fuse by means of the fourth protective impedance and the third protective impedance. It follows that the diagnostic path comprises the third voltage measuring device, which is electrically arranged between a fourth diagnostic pickup and the third diagnostic pickup, the fourth measuring pickup being electrically connected to the fourth diagnostic pickup by means of the fourth protective impedance. By virtue of the first fuse, overloading of the switch due to excessive current flow resulting from, e.g., a short-circuit in or of the heating element is effectively prevented, the first fuse being monitored by means of the third voltage measuring device. It is consequently possible to determine rather quickly whether the first fuse has tripped. The fourth protective impedance is preferably structurally identical to the first, second and/or third protective impedances, or may be of at least the same resistance value. More particularly, the fourth protective impedance is connected to the reference potential by means of an additional impedance, such additional impedance being structurally identical to an additional impedance by means of which the first, second and/or third protective impedance(s) are connected to the reference potential.

Alternatively or in combination with this, the current path comprises a second fuse, which need not be bridged. In particular, the second fuse may be visually monitored by an operator of the synthetic-material molding system, or the second fuse may be monitored by means of a further monitoring device. The first measuring pickup in this arrangement is positioned between the second fuse and, if present, the heating element. It follows that the first measuring pickup is likewise arranged between the second fuse and the second measuring pickup. If the first fuse is present, it follows that both sides of the switch and of the heating element are protected by means of an associated fuse, i.e. by the respective first and second fuses, such that a current flow is also interrupted in the event of a short circuit to ground or earth.

A third fuse may be connected between the second measuring pickup and the third measuring pickup, in particular in series with the switch. The third fuse is preferably electrically arranged between the switch and the third measuring pickup. The use of the third fuse here is independent of the presence or absence of the first and/or second fuses.

In accordance with a method for operating an electric heater having a current path that includes a switch in series with a heating element, the switch being bridged by a third protective impedance, a second current measuring device and a second protective impedance, and the heating element or a connection interface for a heating element being bridged by a second protective impedance, a first voltage measuring device and a first protective impedance, in a first step or steps of the inventive method a first measurement value is generated by means of the first voltage measuring device and a second measurement value is generated by means of the second voltage measuring device. The first and second measurement values are preferably generated substantially concurrently.

In a further step of the inventive method, the first and second measurement values are compared by reference to a storage table in which expected values for the first and second measurement values are stored. The state or status of the electric heater is usefully determined on the basis of these comparisons. According to the contents of the table, by way of example in an embodiment, correct operation of the heating element is present if the first measurement value is non-vanishing and the second measurement value corresponds essentially to zero. Alternatively or in combination with this, the comparison of the measurement values with the stored contents of the table will indicate that an interruption of the current flow via the switch is present if the first measurement value is vanishing or essentially zero and the second measurement value is not substantially equal to zero.

These and other objects and features of the present invention will become apparent from the following detailed description considered in connection with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein similar reference characters denote similar elements throughout the several embodiments and figures:

FIG. 3 diagrammatically depicts a method for operating the electric heater of FIG. 1 and/or FIG. 2 in accordance with the invention.

DETAILED DESCRIPTION OF THE PRESENTLY PREFERRED EMBODIMENTS

Figure 1:
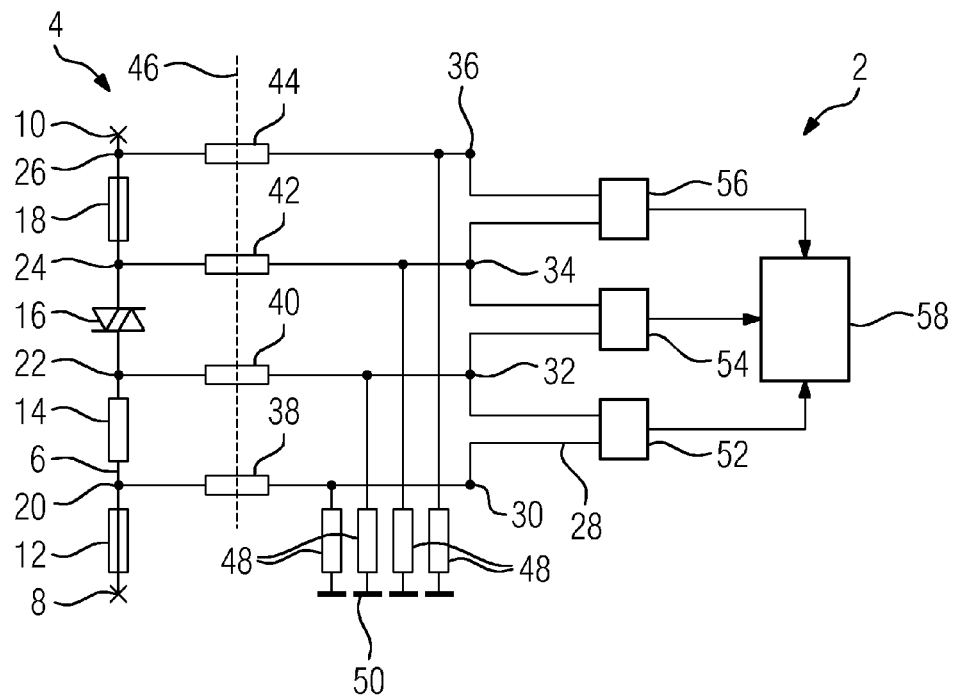
FIG. 1 schematically depicts a first embodiment of an electric heater constructed in accordance with the present invention.

FIG. 1 schematically depicts by way of illustration the relevant portion of a synthetic-material molding system 2 that may be used to produce PET bottles. The synthetic-material molding system 2 includes an electric heater 4 that is operable to heat the synthetic material that is then shaped as by molding to configure and define a bottle or the like (not shown) in a further work step that forms no part of the present invention. The electric heater 4 has a current path 6 that includes a first connection interface point 8 and a second connection interface point 10, these forming the ends or termination points of current path 10. The first and the second connection interface points 8, 10 are electrically connected for use of the system 2 to an alternating current source (not shown) of 300 A, for example, each connection interface point 8, 10 being connected to a terminal of the current source in an electrically conductive manner.

A second fuse 12, a heating element 14, an electric switch 16 in the form of a TRIAC, and a first fuse 18 are connected in series between the first and second connection interface points 8, 10. In accordance with the invention, a first measuring pickup 20 is electrically arranged between the second fuse 12 and the heating element 14, a second measuring pickup 22 is electrically arranged between the heating element 14 and the switch 16, a third measuring pickup 24 is electrically arranged between the switch 16 and the first fuse 18, and a fourth measuring pickup 26 is electrically arranged between the first fuse 18 and the second connection interface point 10. As a consequence of this construction, when the switch 16 is closed an electric current flows from the first connection interface point 8 via the second fuse 12, the first measuring pickup 20, the heating element 14, the second measuring pickup 22, the switch 16, the third measuring pickup 24, the first fuse 18 and the fourth measuring pickup 26 to the second connection interface point 10.

The electric heater 4 also includes a diagnostic path 28 formed by a first diagnostic pickup 30, a second diagnostic pickup 32, a third diagnostic pickup 34 and a fourth diagnostic pickup 36, these being connected in series. The first measuring pickup 20 is electrically connected to the first diagnostic pickup 30 by means of (i.e. through) a first protective impedance 38, the second measuring pickup 22 is electrically connected to the second diagnostic pickup 32 by means of a second protective impedance 40, the third measuring pickup 24 is electrically connected to the third diagnostic pickup 34 by means of a third protective impedance 42, and the fourth measuring pickup 26 is electrically connected to the fourth diagnostic pickup 36 by means of a fourth protective impedance 44. As currently contemplated, the resistance value of each of the first, second, third and fourth protective impedances 38, 40, 42, 44 is substantially identical and equals about 1 MΩ. The first, second, third, fourth and protective impedances 38, 40, 42, 44 represent the only electrical connections between the current path 6 and the diagnostic path 28, thereby forming an effective impedance wall 46 as a consequence of which any current flow from the current path 6 to the diagnostic path 28 is reduced to a comparatively limited value.

The electric heater 4 also has four additional impedances 48 of the same type, each of which is connected to a reference potential 50, namely ground. The resistance value of the additional impedances 48 is about 2 kΩ. Each of the additional impedances 48 is also electrically connected to a respective one of the diagnostic pickups 30, 32, 34, 36, which therefore vary from the reference potential 50 by a very slight amount by virtue of the comparatively limited resistance values of additional impedances 48. Each of the first, second, third and fourth protective impedances 38, 40, 42, 44 is thus connected to reference potential 50 via a respective additional impedance 48.

A first voltage measuring device 52 is electrically connected between the first diagnostic pickup 30 and the second diagnostic pickup 32, a second voltage measuring device 54 is electrically connected between the second diagnostic pickup 32 and the third diagnostic pickup 34, and a third voltage measuring device 56 is electrically connected between the third diagnostic pickup 34 and the fourth diagnostic pickup 36. The voltage measuring devices 52, 54, 56 are configured as comparators, and are used solely to determine a voltage difference between the respective diagnostic pickups 30, 32, 34, 36, between which the respective voltage measuring devices 53, 54, 56 are connected. Accordingly, a predetermined minimum potential difference between the first diagnostic pickup 30 and the second diagnostic pickup 32 can be determined by means of the first voltage measuring device 52. By way of example, a potential difference greater than 0.2 volts will be detected by each of the respective voltage measuring devices 52, 54, 56. Put another way, the voltage measuring devices 52, 54, 56 can only detect the presence of a potential difference greater than or equal to, e.g., 0.2 volts. The voltage measuring devices 52, 54, 56 are connected to a control circuit 58 that evaluates the binary measurement values that have been generated by voltage measuring devices 52, 54, 56.

During operation of the electric heater 4, a method 60 depicted in FIG. 3 is carried out. The switch 16 is first activated such that a current flow takes place between the first and second connection interface points 8, 10. In other words, the switch 16 is closed, whereupon an alternating current flows via the current path 6 with a current strength of about, e.g., 200 amps. The heating element 14, in the form of a heating resistor, is thereby heated. Also in a first step 62 of the inventive method, a first measurement value 64 is generated by the first voltage measuring device 52 and is supplied to the control circuit 58. In accordance with the invention, provision is made for determining whether a potential difference exists between the first diagnostic pickup 30 and the second diagnostic pickup 32, ignoring possible zero crossings caused by the frequency of the alternating current. The first measurement value 64 therefore corresponds to either the binary value "0", which indicates an electric voltage of less than 0.2 volts between the two diagnostic pickups 30, 32, or the binary value "1", which indicates an electric voltage of more than 0.2 volts.

At substantially the same time, a second measurement value 68 is generated in a second method step 66 by means of the second voltage measuring device 54, in the same way as the first measurement value 64. Likewise, a third measurement value 72 is substantially concurrently generated in the same way in a third method step 70 by means of the third voltage measuring device 56. The three measurement values 64, 68, 72 are supplied to the control circuit 58 in a fourth method step 74 and are compared with the values stored in a table 76 of or associated with the control circuit 58. The contents of table 76 indicate that the first fuse 18 is damaged if the first measurement value 64 is "0", the second measurement value 68 is "0" and the third measurement value 72 is "1", this state being represented as the logical expression "0,0,1", the first position representing the first measurement value 64, the second position representing the second measurement value 68, and the third position representing the third measurement value 72. In further accordance with the contents of table 76, a value or logical expression of "0,1,0" indicates that the switch 16 is open, and a value or logical expression of "1,0,0" indicates that the heating element 14 is working correctly.

Figure 2:
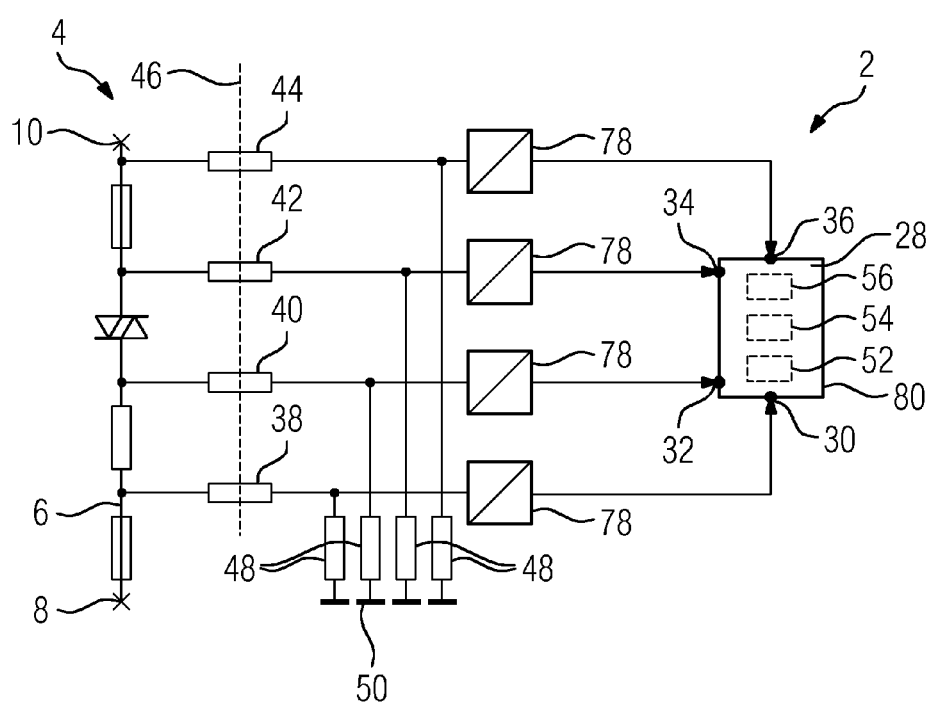
FIG. 2 schematically depicts a further embodiment of an inventive heater, similar to that shown in FIG. 1.

FIG. 2 schematically depicts a further embodiment of the synthetic-material molding system 2 that includes the electric heater 4. The current path 6 remains unchanged from that of the FIG. 1 embodiment. The first, second, third, and fourth protective impedances 38, 40, 42, 44 and their electrical connections to the current path 6 also correspond to those of the FIG. 1 embodiment. The protective impedances 38, 40, 42, 44 are likewise connected to ground 50 by means of respective associated additional impedances 48.

However, unlike in the FIG. 1 embodiment, the electric heater 4 includes four A/D converters 78, each of which is electrically connected between one of the protective impedances 38, 40, 42, 44 and the respective associated diagnostic pickup 30, 32, 34, 36. In other words, one of the A/D converters 78 is arranged between the first protective impedance 38 and the first diagnostic pickup 30, a second of the A/D converters 78 is arranged between the second protective impedance 40 and the second diagnostic pickup 32, a third of the A/D converters 78 is arranged between the third protective impedance 42 and the third diagnostic pickup 34, and the remaining (fourth) A/D converter 78 is arranged between the fourth protective impedance 44 and the fourth diagnostic pickup 36.

The analog potential value that is present at each respective protective impedance 38, 40, 42, 44 is converted into a digital word by means of the associated A/D converter 78 and is supplied to the respective diagnostic pickup 30, 32, 34, 36. These digital words are compared with each other by means of the first, second and third voltage measuring devices 52, 54, 56, the digital words being subtracted from each other. In accordance with this embodiment of the invention, the first, second and third current measuring devices 52, 54, 56 are incorporated in a shared computing unit 80 that takes the form of an integrated circuit. The computing unit 80 also forms the diagnostic path 28 in this embodiment.

The operation of the FIG. 2 embodiment of the electric heater 4 is likewise in accord with the method 60, as previously described, although the table 76 is larger and contains not only qualitative but also quantitative values. Nevertheless, by virtue of the cascading of the individual current measuring devices 52, 54, 56, both the FIG. 1 and the FIG. 2 embodiments allow for reduced manufacturing costs and greater ease of operation.

While there have been shown and described and pointed out fundamental novel features of the invention as applied to preferred embodiments thereof, it will be understood that various omissions and substitutions and changes in the form and details of the devices illustrated and in their operation, and in the methods of the invention, may be made by those skilled in the art without departing from the spirit of the invention. It is the intention, therefore, to be limited only as indicated by the scope of the claims appended hereto.

What is claimed is:

1. An electric heater, comprising:
   a current path comprising a first measuring pickup, a second measuring pickup, a switch, and a third measuring pickup, all connected in electrical series to define the current path with a heating element connected between the first measuring pickup and the second measuring pickup;
   a diagnostic path comprising a first diagnostic voltage pickup, a first voltage measuring device, a second diagnostic voltage pickup, a second voltage measuring device, and a third diagnostic voltage pickup, all connected in electrical series;

a first protective impedance electrically connecting the first measuring pickup to the first diagnostic voltage pickup;

a second protective impedance electrically connecting the second measuring pickup to the second diagnostic voltage pickup; and a third protective impedance electrically connecting the third measuring pickup to the third diagnostic voltage pickup.

2. An electric heater in accordance with claim 1, wherein a resistance value of each of the first, second and third protective impedances is the same.

3. An electric heater in accordance with claim 1, wherein at least one of the first protective impedance, the second protective impedance and the third protective impedance is connected to a reference potential by an additional impedance.

4. An electric heater in accordance with claim 3, wherein the reference potential is ground.

5. An electric heater in accordance with claim 1, wherein the switch comprises a TRIAC.

6. An electric heater in accordance with claim 1, further comprising a control circuit, and wherein each of the first and second voltage measuring devices comprises a comparator connected to the control circuit.

7. An electric heater in accordance with claim 1, further comprising first, second and third A/D converters, wherein the first A/D converter is connected between the first protective impedance and the first diagnostic voltage pickup, the second A/D converter is connected between the second protective impedance and the second diagnostic voltage pickup, and the third A/D converter is connected between the third protective impedance and the third diagnostic voltage pickup, and wherein the first and second voltage measuring devices are incorporated in a shared computing unit.

8. An electric heater in accordance with claim 1, further comprising a fourth protective impedance, wherein the diagnostic path further comprises a fourth diagnostic voltage pickup and a fourth voltage measuring device, wherein the current path further comprises a fourth measuring pickup and a first fuse connected between the fourth measuring pickup and the third measuring pickup, wherein the fourth protective impedance electrically connects the fourth measuring pickup to the fourth diagnostic voltage pickup, and wherein the third voltage measuring device is electrically connected between the fourth diagnostic voltage pickup and the third diagnostic voltage pickup.

9. An electric heater in accordance with claim 1, wherein the current path further comprises a second fuse, and wherein the first measuring pickup is connected between the second fuse and one of the heating element and the second measuring pickup.

10. An electric heater in accordance with claim 1, wherein the switch is connected between the second measuring pickup and the third measuring pickup.

11. A method for operating the electric heater of claim 1, comprising the steps of:

generating a first measurement value from the first voltage measuring device;

generating a second measurement value from the second voltage measuring device; and comparing the first and second measurement values with stored values in a table of stored values.

\* \* \* \* \*